United States Patent [19]

Mansfield et al.

[11] Patent Number: 5,416,414
[45] Date of Patent: May 16, 1995

[54] SAMPLE MOUNT FOR NMR MICROSCOPY

[75] Inventors: Peter Mansfield; Paul Glover, both of Beeston, England

[73] Assignee: British Technology Group Limited, London, England

[21] Appl. No.: 203,491

[22] Filed: Feb. 28, 1994

Related U.S. Application Data

[63] Continuation of Ser. No. 941,099, Oct. 27, 1992, abandoned.

[30] Foreign Application Priority Data

Apr. 27, 1990 [GB] United Kingdom ............... 9009476

[51] Int. Cl.⁶ .................................................. G01R 33/30
[52] U.S. Cl. .................................. 324/318; 3424/321
[58] Field of Search ............... 324/318, 322, 300, 313, 324/314, 315; 335/282, 299; 359/395, 396

[56] References Cited

U.S. PATENT DOCUMENTS

| | | | |
|---|---|---|---|
| 4,254,373 | 3/1981 | Lippmaa et al,. | 324/321 |
| 4,649,348 | 3/1987 | Flugan | 324/321 |
| 4,684,894 | 8/1987 | Bliehall | 324/318 |
| 4,888,463 | 12/1989 | Middlebrook | 359/395 |
| 5,184,078 | 2/1993 | Rapoport | 324/321 |
| 5,258,710 | 11/1993 | Black et al. | 324/309 |

FOREIGN PATENT DOCUMENTS

| | | |
|---|---|---|
| 0165741 | 12/1985 | European Pat. Off. . |
| 0029770 | 3/1978 | Japan ............... 324/321 |
| 0358682 | 11/1972 | U.S.S.R. ........... 359/395 |

OTHER PUBLICATIONS

Patent Abstracts of Japan, vol. 12, No. 319(P-751)(3166), & JP A 6385437 (Yokogawa Medical Syst Ltd), 15 Apr. 1988.

Cho et al "Nuclear magnetic resonance microscopy . . ." Medical Physics, vol. 15, No. 6, Nov. 1988, pp. 821-823.

Dixon et al "Simple design for measurement of optical spectra . . ." Review of Scientific Instr., vol. 59, No. 6, pp. 921, 922. (Jun. 1988).

Fan et al "A UHF probe for NMR Micro-imaging experiments" Magnetic Resonance in Medicine, vol. 1, 8, 10, No. 6 Jun. 1987, pp. 591-593.

Kuhn "NMR microscopy-fundamentals, limits . . ." Angewandte Chemie, vol. 29, No. 1 Jan. 1990, pp. 1-19.

*Primary Examiner*—Sandra L. O'Shea
*Assistant Examiner*—Raymond Y. Mah
*Attorney, Agent, or Firm*—Nixon & Vanderhye

[57] ABSTRACT

A sample mount for NMR microscopy and NMR spectroscopy which enables a specimen to be accurately placed within an NMR apparatus and if required in a preferred embodiment for the specimen to be examined under an optical microscope to enable the images to be accurately compared.

11 Claims, 7 Drawing Sheets

SAMPLE MOUNT FOR NMR MICROSCOPY

This is a continuation cip of application Ser. No. 07/941,099, filed Oct. 27, 1992, now abandoned.

The present invention relates to sample mounts for NMR microscopy and more particularly to a sample mount which can be used for both optical microscopy and NMR microscopy by which is meant the production of two dimensional images of the object and/or the production of NMR spectra.

BACKGROUND OF THE INVENTION

In optical microscopy tissue specimens and cell cultures are prepared for examination by staining in order to increase contrast so as to highlight particular structures.

An object of the present invention is to devise a specimen mounting that would enable examination by both optical microscopy and NMR microscopy. This is particularly important in establishing correspondence between specimen features.

SUMMARY OF THE INVENTION

A sample mount for NMR microscopy and spectroscopy including an RF coil characterised in that the mount includes a substrate layer, the RF coil being mounted adjacent to the substrate layer, a cover slip mounted adjacent to the coil on the opposite side to the substrate layer, the cover slip and substrate layer being sealed together to environmentally seal the coil in which the RF coil forms part of a tuned circuit formed by additional electrical components mounted on the substrate layer and in which the tuned circuit is formed to be able to be externally coupled to enable a signal generated within the RF coil to be received and processed.

Preferably, the coupling means is capacitive, inductive or radiative.

Preferably, the sample mount further comprises a further glass cover slip removably mounted on to the cover slip on the opposite side of the cover slip to the substrate, the further cover slip being spaced apart from the cover slip, a specimen to be examined being positioned between the two cover slips and adjacent to the RF coil.

BRIEF DESCRIPTION OF THE DRAWINGS

Embodiments of the present invention will now be described, by way of example with reference to the accompanying drawings, in which:

FIG. 5($a$) shows an optical micrograph of one layer of onion cells, and

FIG. 5($b$) shows an NMR image of one layer of onion cells, the image comprises 256×256 pixels with 4.7 µm in-plane resolution;

FIG. 7($a$) shows an alternative slide coil arrangement in which the $B_1$ field is produced by a flat conductive strip or set of parallel wires. This coil arrangement is fixed to a glass substrate and protected by a glass cover slip. The specimen is brought close to a plate and the effective magnetic field B is enhanced and made uniform by the presence of a highly conductive metallic sheet, FIG. 7($b$) shows a side view of the slide coil arrangement in FIG. 7($a$)

DETAILED DESCRIPTION OF THE INVENTION

Figure 1:
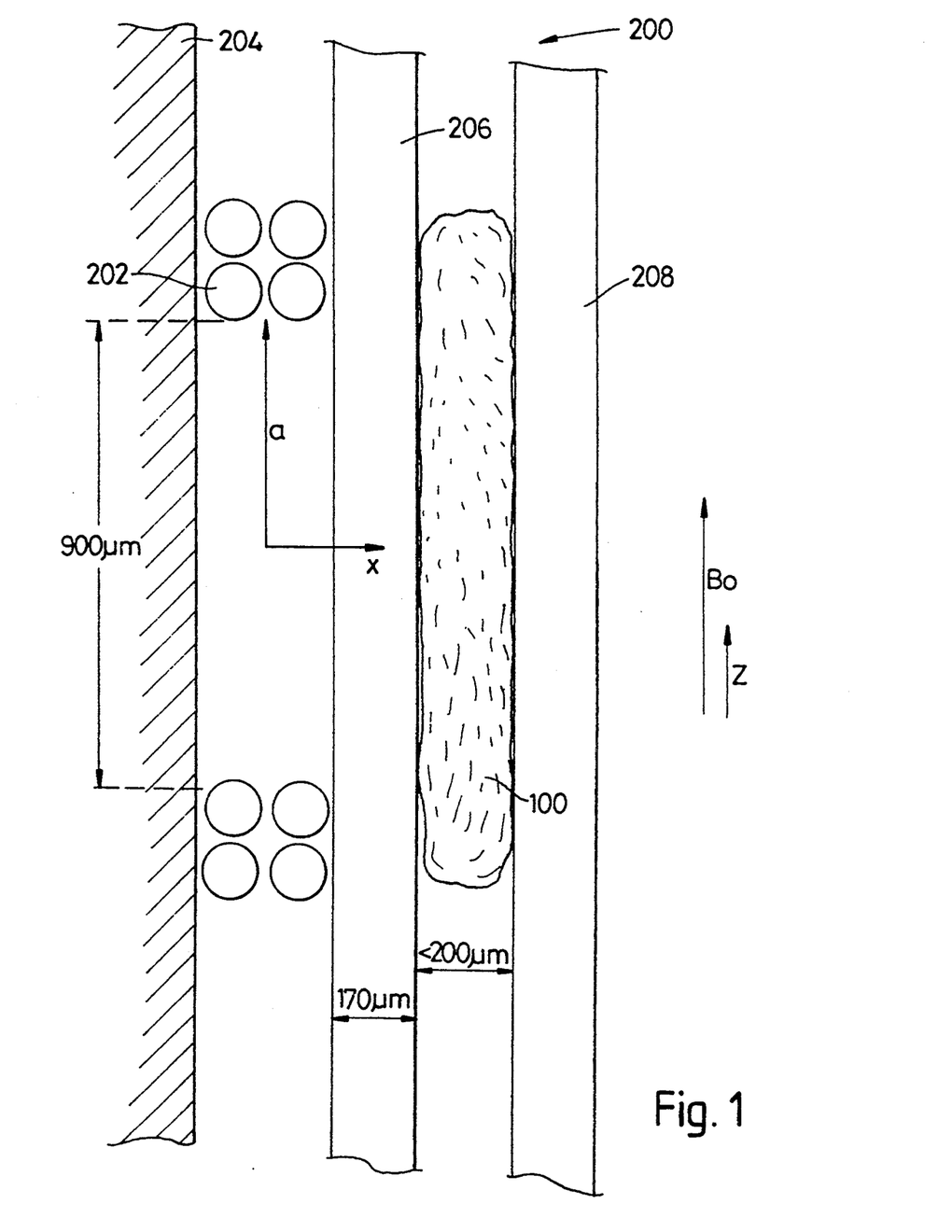
FIG. 1 shows a side view of a sample mount according to the present invention illustrating a slide coil arrangement and in which the position of a typical specimen is also indicated.

In the NMR specimen mount according to the present invention, sample 100 is, placed on a slide 200 which includes an integrated tuned RF coil 202. The RF coil is sealed between a standard glass microscope slide substrate 204 and a first cover slip 206 so the whole slide assembly can be washed for re-use. The use of a glass substrate allows for the sample 100 to be viewed under a normal optical microscope but if this is not required then the slide substrate 204 could be made from a suitable synthetic plastics material or other material. The sample 100 is placed between the first cover slip 206 and a second removable cover slip 208.

The slide 200 can be examined using conventional optical microscopy and then placed in the NMR magnet (not shown) and imaged, or spectroscopic information obtained using the optical picture as a guide to particular areas of interest. There is no physical link to the slide, signals picked up in the coil 202 being coupled to a loosely coupled secondary coil (see for example FIG. 8) which is preferably matched to 50 Ω.

The slide assembly mounts on the Rf stage of an NMR apparatus in a holder (FIG. 8) which positions the sensitive region in the centre of the gradient coil (not shown). The microscope slide system would be particularly suitable for use with flat gradient coils.

NMR apparatus and gradient coils for use therein are well known and these will not therefore be further described. The operation is as follows:

The sample 100 is placed close to the flat RF coil 202 comprising N turns, FIG. 1. Let the coil radius be a and the axial distance from the centre of coil be x. The field $B_x$ at distance x from coil is $$B_x = \frac{\mu_0 N I a^2}{2(x^2 + a^2)^{3/2}}$$

The field relative to that obtained at the coil centre is $$B_{rel} = \frac{1}{(k^2 + 1)^{3/2}}$$

where k is given by $$x = ka$$

Over a 100 μm slice using a 900 μm diameter RF coil 202 and 170 μm cover slips 206 and 208, the average $B_{rel}$ approaches 0.85 so that this arrangement, though not perfect loses only around 15% of the available signal.

Figure 2:
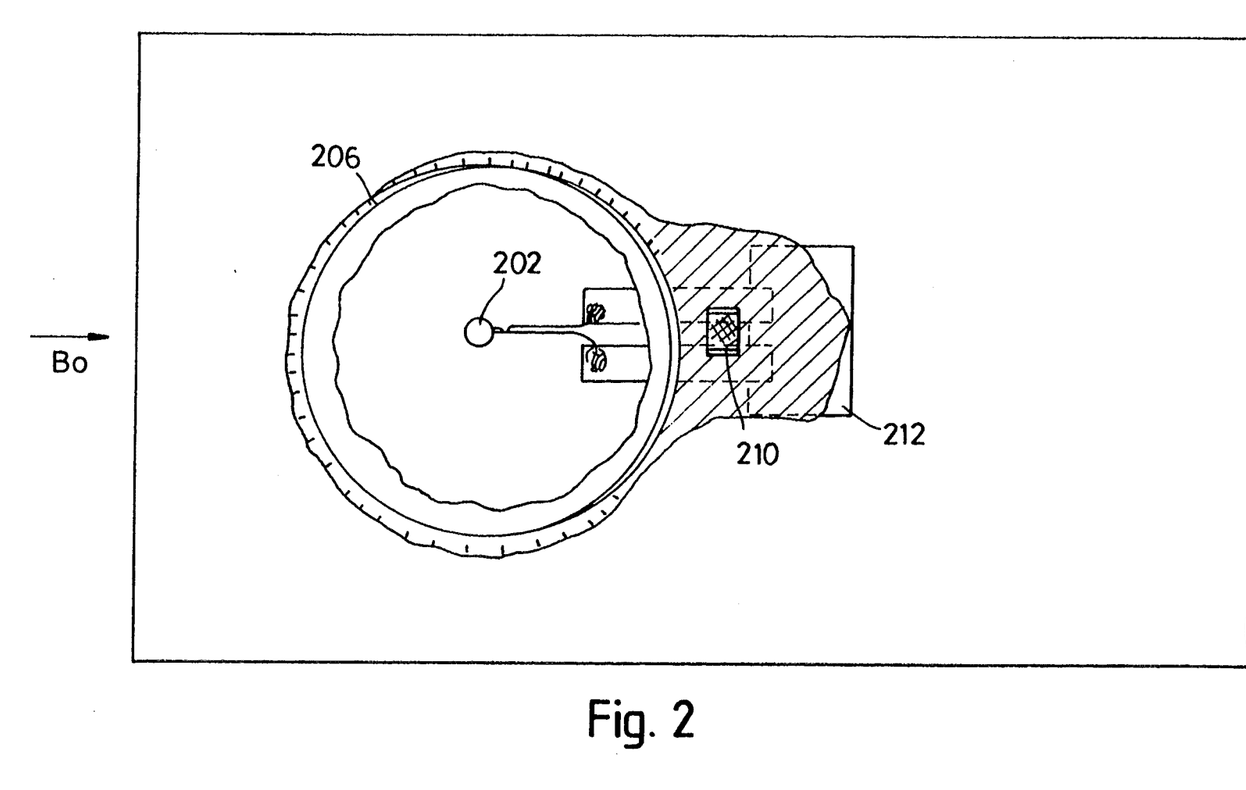
FIG. 2 shows a plan view of the slide coil arrangement of FIG. 1 shows an RF coil and tuning arrangement, the coil being sealed between the slide substrate and cover slip.

A plan view of the slide coil arrangement is shown in FIG. 2. The RF coil forms part of resonant circuit tuned with a hip capacitor (210). Fine tuning is achieved with a sliding copper foil trimmer 212. The RF coil 202 is inductively coupled to the transmitter/receiver system of the NMR microscopy (not shown). The circuit arrangement is represented schematically in FIG. 3.

Figure 3:
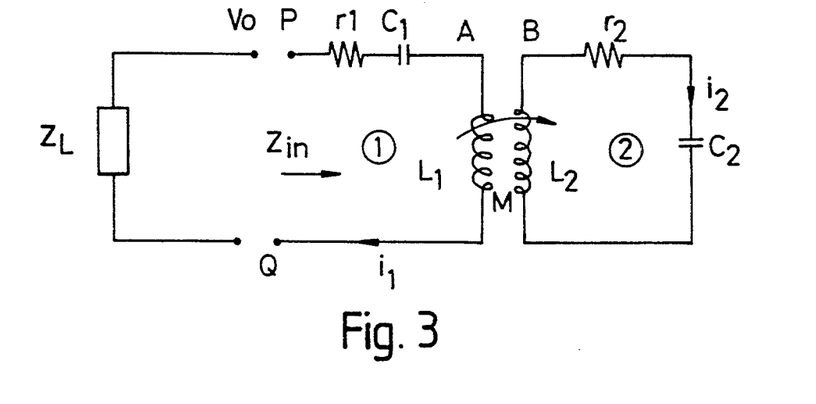
FIG. 3 shows an equivalent circuit of the slide mounted coil and tuning arrangement (circuit 2); also shown is the circuit drive and coupling inductor $L_1$, alternative capacitive drive arrangement being provided when points A and B are joined together and $L_1$ replaced by a capacitor.

For the $i_1$ loop we have $$V_o - jwl_1 i_1 - (i_1/jwc_1) - i_1 r_1 jwMi_2 = 0$$

where $V_o$ is the output voltage across points P and Q, $i_1$ is the primary current in loop 1, $i_2$ is the secondary current in loop 2, $r_1$, $c_1$ and $L_1$ are resistance series capacitance and inductance of loop 1. M is the mutual inductance between loops 1 and 2. $r_2$, $c_2$ and $L_2$ are the resistance capacitance and inductance respectively of loop 2.

For the $i_2$ loop we have $$jwMi_1 - jwl_2 i_2 - i_2 r_2 - i_2/jwC_2 = 0$$

which gives $$i_2 = i_1 jwM/(jwL_2 + r_2 + 1/jwC_2)$$

The input impedanceis gives by $$Z_{in} = V_o/i_1 = j\omega L_1 + 1/j\omega C_1 + r_1 + \frac{\omega^2 M^2}{j\omega L_2 + r_2 + 1/j\omega C_2}$$

At resonance $jwL_1 = -1/jwC_1$ and $jwL_2 = -1/jwC_2$ which gives $$Z_{in} = \frac{\omega^2 M^2}{r_2} + r_1 = r_1(1 + Q^2 k^2)$$

where $$k = \frac{M}{\sqrt{L_1 L_2}}$$

$$Z_{in} = V_o/i_1 = j\omega L_1 + 1/j\omega C_1 + r_1 + \frac{\omega^2 M^2}{j\omega L_2 + r_2 + 1/j\omega C_2}$$

and 0 is the quality factor.

Experimentally the coefficient of coupling k is approximately 0.01.

The voltage transfer function $V_o = -i_1 Z_1$. For the $i_1$ loop where $V_2$ is the load impedance and $V_2$ is the load voltage, $$V_o - i_1 r_1 - jwL_1 i_1 + jwMi_2 - i_1 jwC_1 = 0$$

and for the $i_2$ loop $$-V + jwMi_1 - jwL_2 i_2 - i_2 r_2 - i_2/jwC = 0$$

Combining these results we obtain $$V_o(1 + r_1/Z_L + j\omega L_1/Z_L + 1/Z_L j\omega C_1) = \frac{Vj\omega M}{r_2} + \frac{\omega^2 M^2 V_o}{r_2 Z_L}$$

At resonance the above result reduces to $$V_o\left(1 + r_1/Z_L + \frac{Z_{in} - r_1}{Z_L}\right) = jV_2\left[\frac{Z_{in} - r_1}{r_2}\right]^{\frac{1}{2}}$$

If $r_1 < < Z_L$ and $Z_{in} = Z_L$ then $$V_o = \frac{jV_2}{2}\left[\frac{Z_{in}}{r_2}\right]^{\frac{1}{2}}$$

This result is identical to that obtained when the tuned coil 202 is directly coupled to the transmitter/receiver system, i.e. when A is joined to B and $L_1$ is replaced by a capacitor. In this case $$Z_{in} = r_1 Q^2 (C_1/C_2)^2$$

for $C_1 < C_1$. Setting $k = (C_1/C_2)$ gives the same result as that for inductive coupling. The electrical equivalence of the two coupling arrangements means that inductive coupling may be used without degrading the signal reception, thus obviating solder or other connections.

Figure 4:
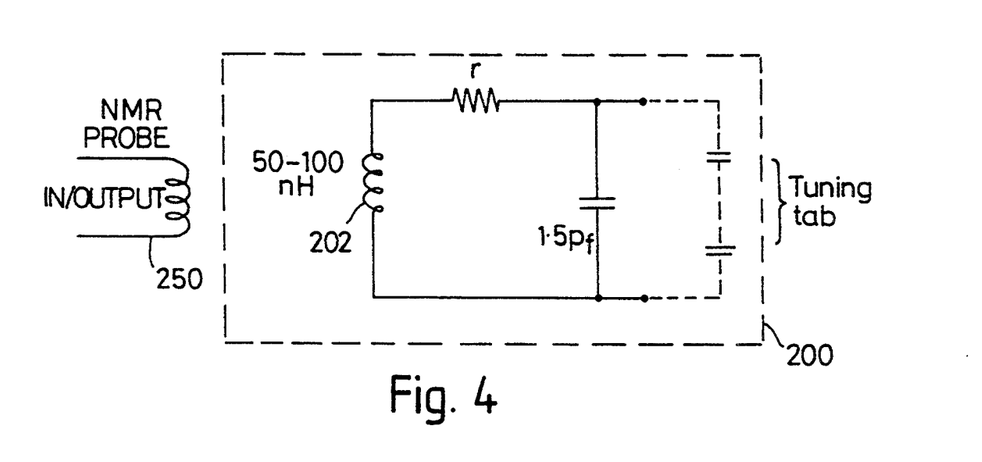
FIG. 4 shows the effective circuit of the slide coil arrangement shown in FIG. 2.

FIGS. 1 and 2 show the construction of the slide coil. The effective circuit on the slide is shown in FIG. 4. The coil assembly is sealed against liquid ingress using glass cover slip 206. The copper foil tuning tab 212 on the reverse side of the slide is at earth potential thus electrically balancing the coil 202. The chip capacitor 210 is preferably placed about 10 mm from the coil 202 thereby minimising its adverse effects on an image due to the ceramic and metal parts it contains. The coil 202 preferably comprises 4–6 turns of polyurethane insulated 34 SWG copper wire. The microscope slide 200 is placed in a holder (not shown) which contains a pickup coil (not shown) than couples to the slide circuit and also contains components for further tuning and matching of the unit.

Images of cells at less than 5 μm resolution have been obtained where the average thickness of the cells is around 70 μm, The quality of the results is dependent on sample preparation which must exclude air bubbles which cause image artefacts due to local gradients. The right liquid medium is important to achieve susceptibility matching. Water with various dopants seems best but we have tried organic solvents like $CCl_4$.

Using gadolinium or manganese doped water good susceptibility matching is achieved and good outline of the cell structure produced with an inversion recovery NMR sequence to null out the extra cellular water.

Figure 5A:
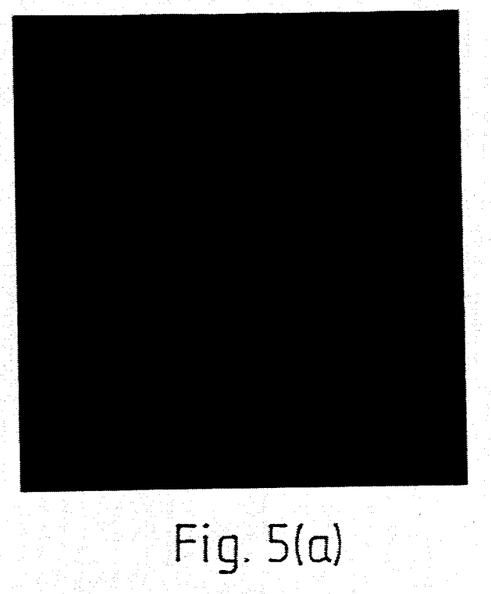
Figure 5B:
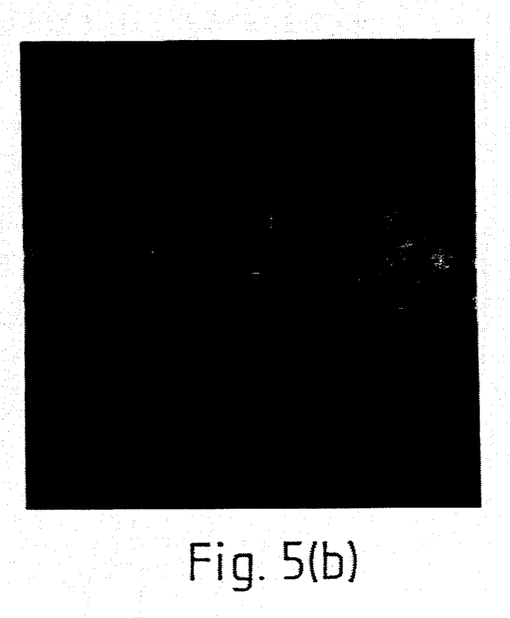

FIG. 5 shows a comparison between an optical micrograph of a layer of onion cells 5a and the corresponding NMR image 5b, In this example Gd-DPTA/water was used to match susceptibility across the extra cellular spaces. The NMR resolution was 4.7 μm.

Figure 6:
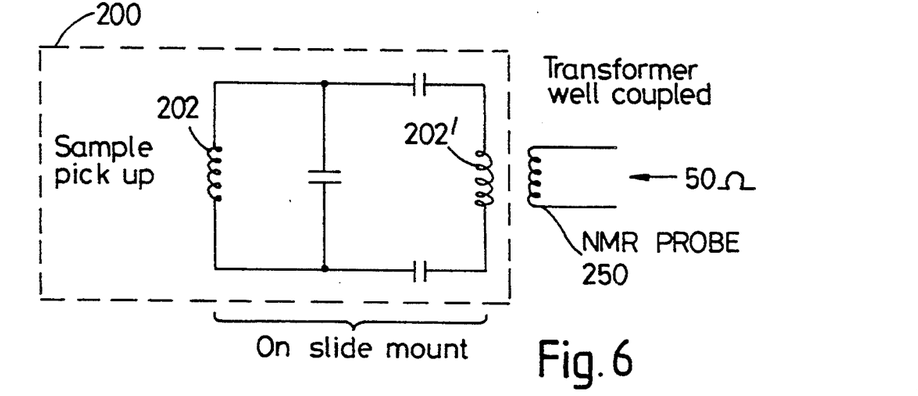
FIG. 6 shows an alternative slide coil arrangement which uses a separate inductive coil.

There are three categories of non-contact coupling: capacitive, inductive and radiative. Capacitive coupling can be used to the slide mounted circuit and requires an arrangement of plates to couple, tune and match. The examples of inductive methods described above require only loose coupling which imposes fewer mechanical constraints. A further approach which would allow more space around the sample area and also obviate coupling to the coil is to use a second coil 202' on the slide 200 as in FIG. 6. An optimum circuit geometry which takes account of the inductive loop and resistance of the leads to the capacitor may be approached experimentally. In a further modification the receiver coil is set into the cover plate 206 or a depression is made in the glass plate 206 to bring the sample closer to the receiver coil, thus increasing the filling factor. In yet further modifications an RF preamlifier (not shown) is included on the slide. In this arrangement coupling to the NMR microscope receiver system would be by either an inductive or capacitive link. In this case there would have to be a separate decoupled transmitter coil.

In a third coupling mode, the NMR signal could be transmitted via an antenna from a micro-transmitter housed on the slide mount.

An advantage of the flat coil 202 is its restricted field of view. However, this results in a lower filling factor and a spatially inhomogenous RF field. A larger filling factor and more uniform field would be obtained using two coils in a Helmholtz arrangement.

Figure 7A:
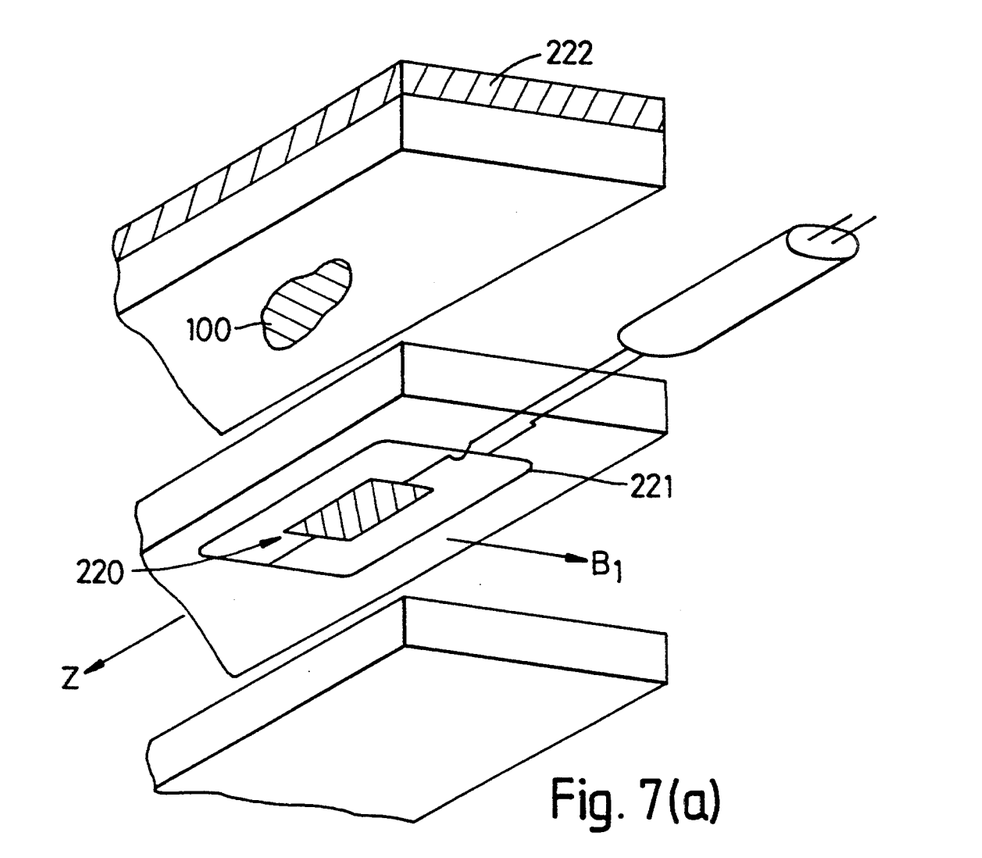
Figure 7B:
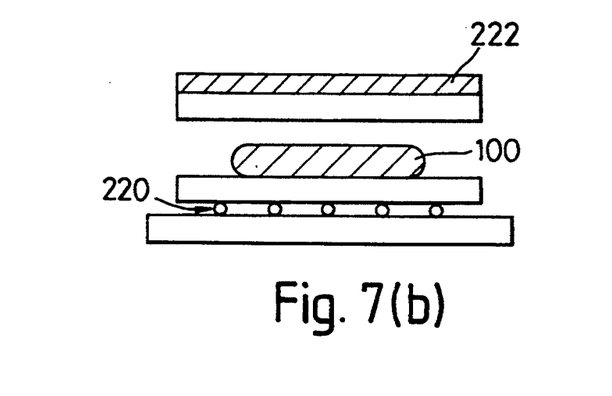

Further flat coil arrangements are possible in which a wire coil array or a single flat conducting strip 220, with current return path 221, FIG. 7, is brought close to a conducting sheet 222 with the specimen sandwiched between. The presence of the conducting sheet increases the RF field in the sample, improving both signal sensitivity and RF inhomogeneity. The conductive sheet may be a metallic glass substrate. For this arrangement coupling to the strip coil 220 may be by direct connections or by a capacitive, inductive or radiative link, as described above.

Figure 8:
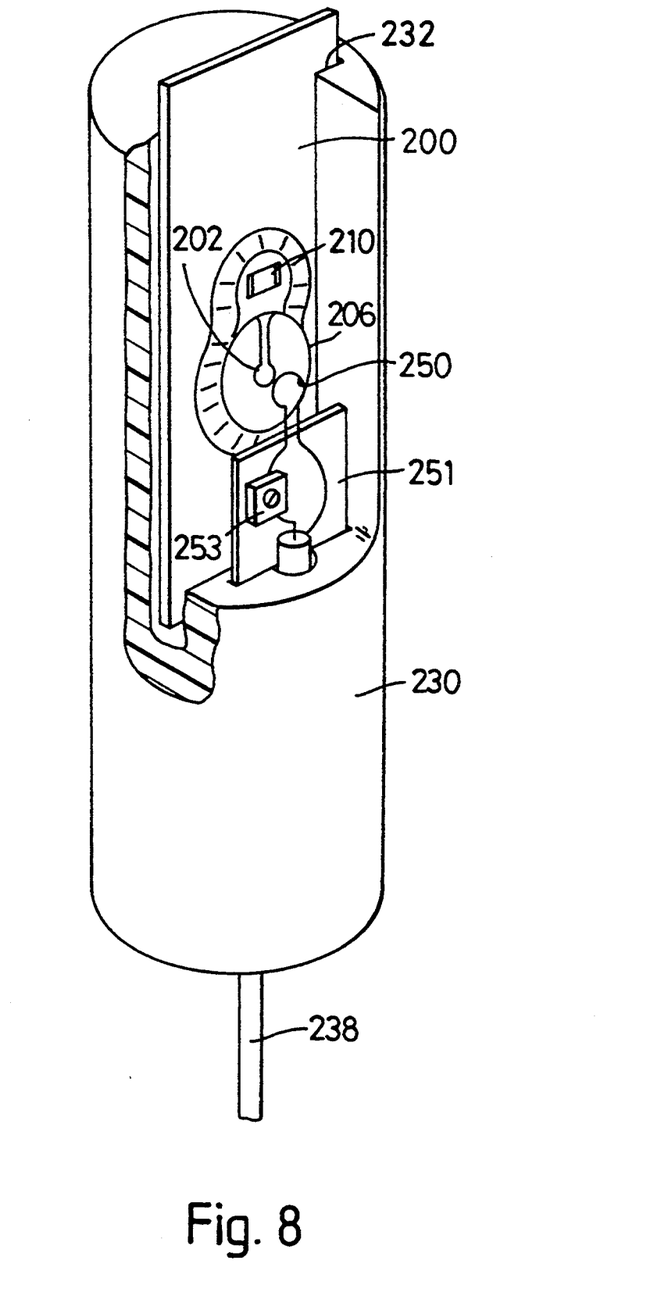
FIG. 8 shows a plastic holder forming part of an NMR probe illustrating accurate positioning of the slide within an NMR apparatus and FIG. 9 shows schematically the slide and slide mount located within an NMR apparatus.
Figure 9:
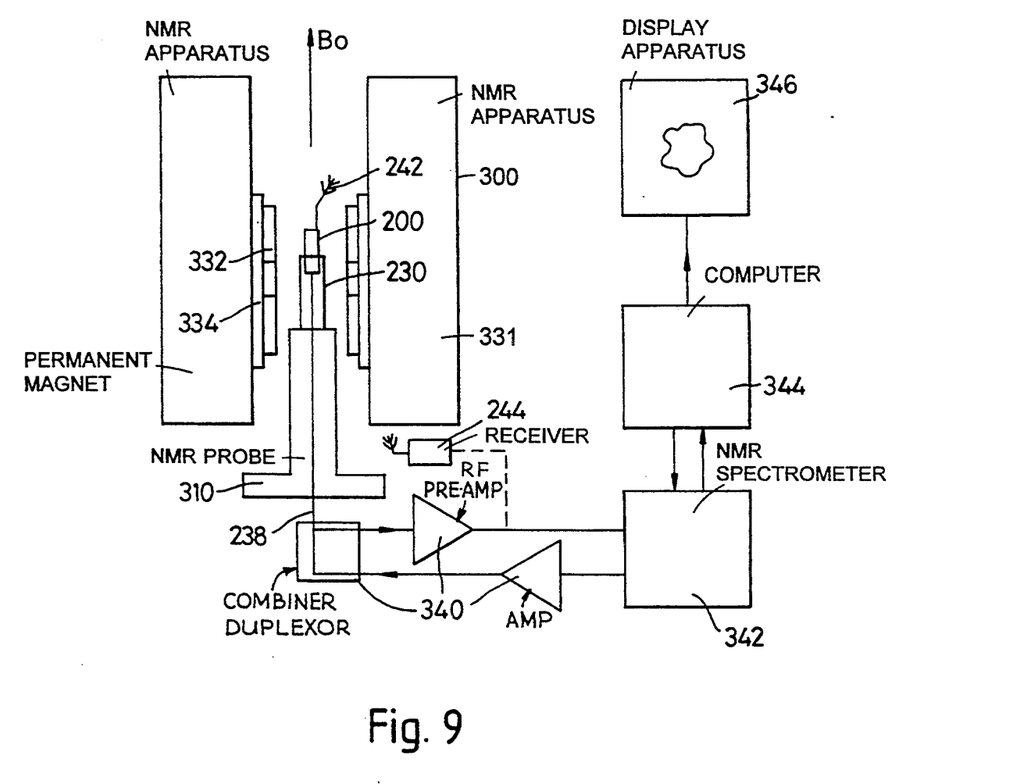

With reference now to FIGS. 8, 9, the slide 200 is shown mounted in a suitable plastic holder 230 which forms part of NMR probe 310 and is mounted within an NMR apparatus 300 which in a known manner comprises a permanent magnet 331 gradient and field coil structures 332, 334. (Further description of the operation of the NMR apparatus is considered unnecessary since the techniques for such operation though both complex and varied are well known to those skilled in the art).

The slide 200 is mounted onto a synthetic plastics holder 230 which forms part of an NMR probe. The holder 230 will be accurately positioned in a defined position within an NMR apparatus and the slide will be therefore accurately positioned within the holder 230 and hence within the NMR apparatus.

The slide 200 is held in holder 230 by, for example, a slotted arrangement 232. RF pickup coil 250 for the NMR apparatus is mounted into the holder 230 and the coil 202 in the sample mount 200 is thus aligned accurately with this RF coil 250 and also with the gradient coils 332. RF coil 250 is connected to a printed circuit board 251 for support and a timing capacitor 253 is also positioned on this board.

The NMR RF Feed/output is taken via cable 238 to suitable transmitter/amplifier apparatus 340 (FIG. 9). A suitable NMR spectrometer 342, computer 344 and display apparatus 346 is shown and operates in known manner.

Alternatively as described hereinbefore a microtransmitter/antenna arrangement 242 could be incorporated into the slide mount to directly transmit the NMR signal to a suitable receiver 244 (FIG. 9).

We claim:

1. A sample mount for NMR microscopy and spectroscopy comprising:
    a substrate layer;
    an RF coil mounted adjacent to the substrate layer;
    a first cover slip mounted adjacent to the RF coil on an opposite side to the substrate layer, the first cover slip and substrate layer being sealed together to environmentally seal the RF coil, said RF coil forming part of a tuned circuit externally coupleable to enable a signal generated within the RF coil to be received and processed.

2. A sample mount as claimed in claim 1, in which said substrate layer and the first cover slip are made from clear glass whereby a sample may be positioned on the cover slip to be thereby viewable under an optical microscope prior to or subsequent to NMR examination.

3. A sample mount as claimed in claim 1, in which the RF coil is coupleable capacitively, inductively or radiatively.

4. A sample mount as claimed in claim 1, in which the sample mount further comprises a second cover slip removably mounted on to the first cover slip on the opposite side of the first cover slip to the substrate layer, the second cover slip being spaced apart from the first cover slip, a specimen to be examined being positionable between the two cover slips and adjacent the RF coil.

5. A sample mount as claimed in claim 1, in which the RF coil is inductively coupled to a transmitter coil in a main NMR probe such that the RF coil behaves as both RF transmitter to and receiver of signals from a specimen under study.

6. A sample mount as claimed in claim 1, in which the RF coil is provided with an amplifier, transmitter and energy source allowing signals picked up from a sample to be transmitted to a remote receiver.

7. A sample mount as claimed in claim 1 in which RF pulses are transmitted to the sample and signals received from the sample by the RF coil are capacitively coupled to a main NMR probe.

8. A sample mount as claimed in claim 4 in which the RF coil is formed by a flat conducting strip and is placed in proximity to a metallic conducting sheet, a specimen being placeable between said first and second cover slips which are sandwiched between the RF coil and the metallic conducting sheet.

9. A sample mount as claimed in claim 4, in which the RF coil is formed from a set of parallel wires and is placed in proximity to a conducting sheet, a specimen being placeable between said first and second cover slips which are sandwiched between the RF coil and the conducting sheet.

10. A sample mount as claimed in claim 8, in which the RF coil forms part of a tuned tank circuit mounted on the coverslip which is directly energized via a screened twin feeder cable.

11. A sample mount as claimed in claim 8, in which the RF coil is inductively coupled via a separate tank circuit mounted on the coverslip and which is itself directly coupled to the RF coil.

* * * * *